United States Patent
Yoneda et al.

(10) Patent No.: US 9,130,083 B2
(45) Date of Patent: Sep. 8, 2015

(54) SEMICONDUCTOR LIGHT RECEIVING DEVICE AND LIGHT RECEIVING APPARATUS

(71) Applicants: SUMITOMO ELECTRIC INDUSTRIES, LTD., Osaka-shi, Osaka (JP); SUMITOMO ELECTRIC DEVICE INNOVATIONS, INC., Yokohama-shi, Kanagawa (JP)

(72) Inventors: Yoshihiro Yoneda, Isehara (JP); Takuya Fujii, Oiso (JP); Tooru Uchida, Atsugi (JP)

(73) Assignees: SUMITOMO ELECTRIC INDUSTRIES, LTD., Osaka (JP); SUMITOMO ELECTRIC DEVICE INNOVATIONS, INC., Yokohama-Shi, Kanagawa (JP)

( * ) Notice: Subject to any disclaimer, the term of this patent is extended or adjusted under 35 U.S.C. 154(b) by 0 days.

(21) Appl. No.: 14/072,463

(22) Filed: Nov. 5, 2013

(65) Prior Publication Data

US 2014/0167107 A1 Jun. 19, 2014

(30) Foreign Application Priority Data

Nov. 5, 2012 (JP) ................. 2012-243836

(51) Int. Cl.
*H01L 31/10* (2006.01)
*H01L 31/0304* (2006.01)
*H01L 31/109* (2006.01)
*H01L 31/103* (2006.01)

(52) U.S. Cl.
CPC ...... *H01L 31/03042* (2013.01); *H01L 31/0304* (2013.01); *H01L 31/03046* (2013.01); *H01L 31/109* (2013.01); *H01L 31/1035* (2013.01)

(58) Field of Classification Search
None
See application file for complete search history.

(56) References Cited

U.S. PATENT DOCUMENTS

2012/0133013 A1* 5/2012 Koyama ................. 257/434
2013/0048838 A1* 2/2013 Mori et al. .............. 250/214.1

FOREIGN PATENT DOCUMENTS

JP 01-259578 10/1989
JP 03-038887 2/1991
WO WO-2011129031 A1 * 10/2011 ............ H01L 27/146

OTHER PUBLICATIONS

Utsunomiya et al., "Nanowatt-Power-Level Automatic-Switch Circuit Combining CMOS and Photodiode", IEEE Conference on Sensors 2010, Kona (HI) USA, Nov. 1-4, 2010, published by IEEE © 2010.*

* cited by examiner

*Primary Examiner* — Johannes P Mondt
(74) *Attorney, Agent, or Firm* — Smith, Gambrell & Russell LLP.

(57) ABSTRACT

A semiconductor light receiving device includes a substrate having an incident surface receiving light incident on the semiconductor light receiving device and a principal surface opposite to the incident surface; a first semiconductor layer disposed on the principal surface of the substrate, the first semiconductor layer defining one of a cathode region and an anode region; a light absorbing region disposed on the first semiconductor layer; and a second semiconductor layer disposed on the light absorbing region, the second semiconductor layer defining the other of the cathode region and the anode region and forming a junction with the light absorbing region. The light absorbing region includes a semiconductor layer having a conductivity type opposite to the conductivity type of the first semiconductor layer. The semiconductor layer of the light absorbing region forms a p-n junction with the first semiconductor layer.

10 Claims, 9 Drawing Sheets

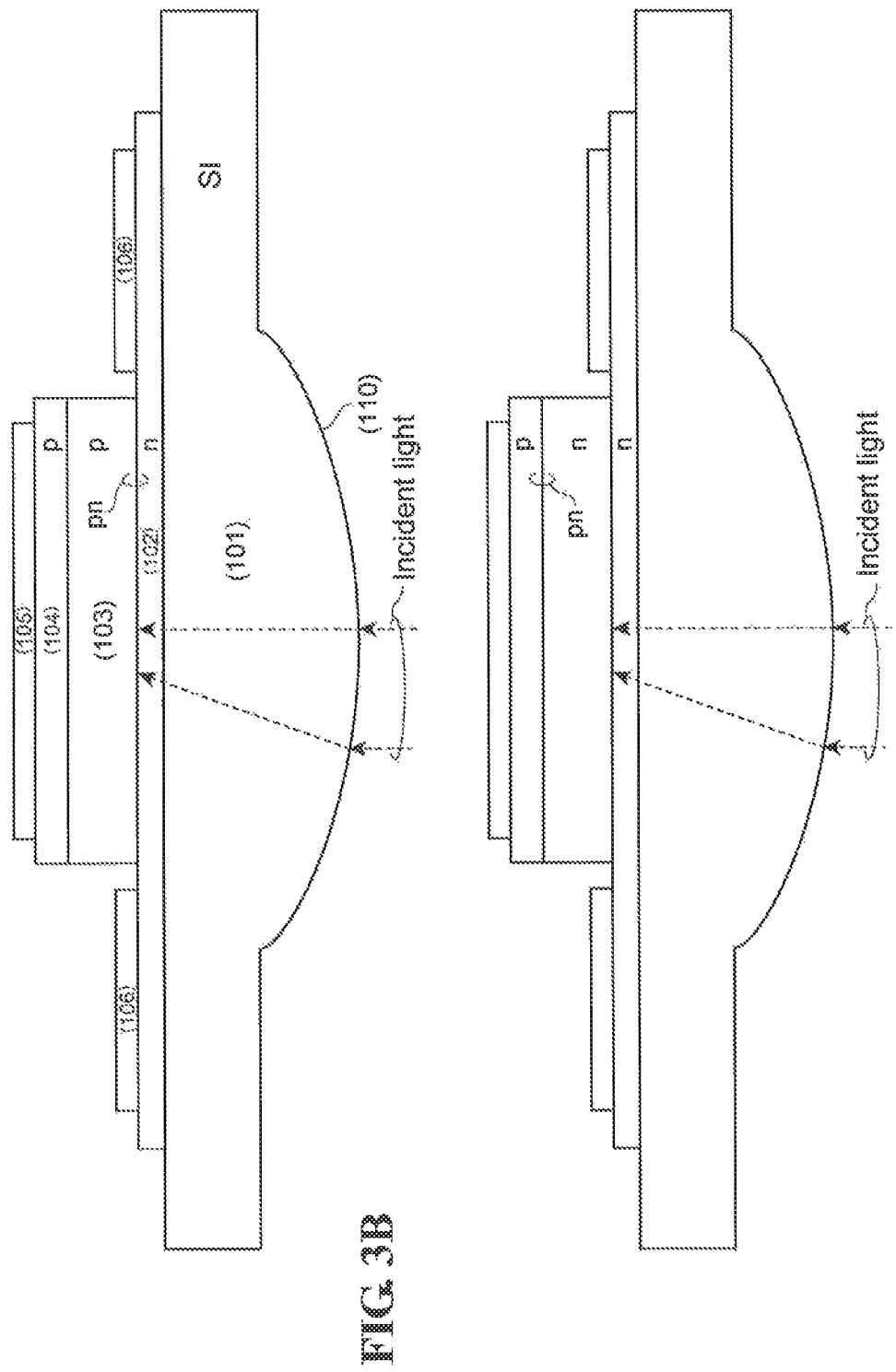

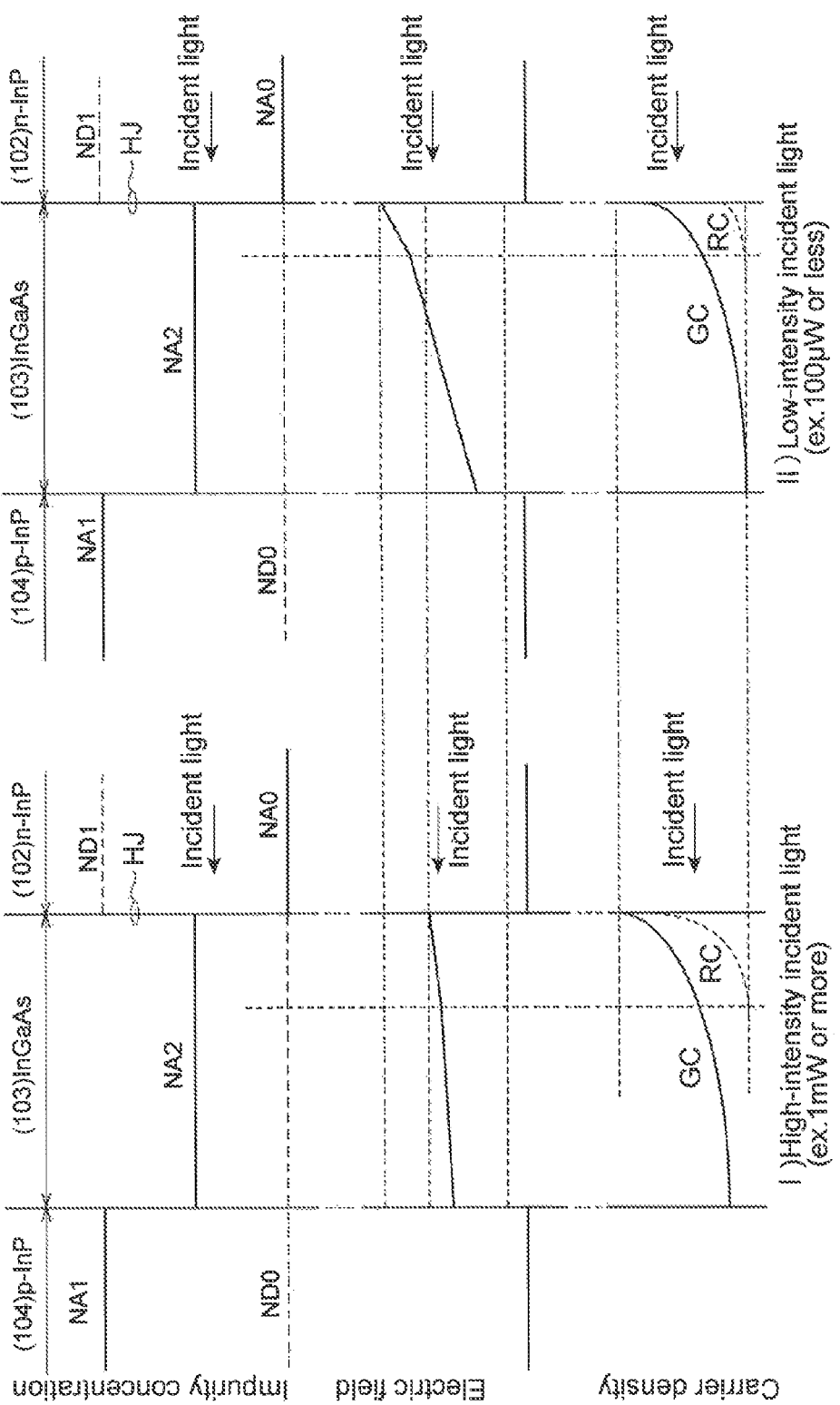

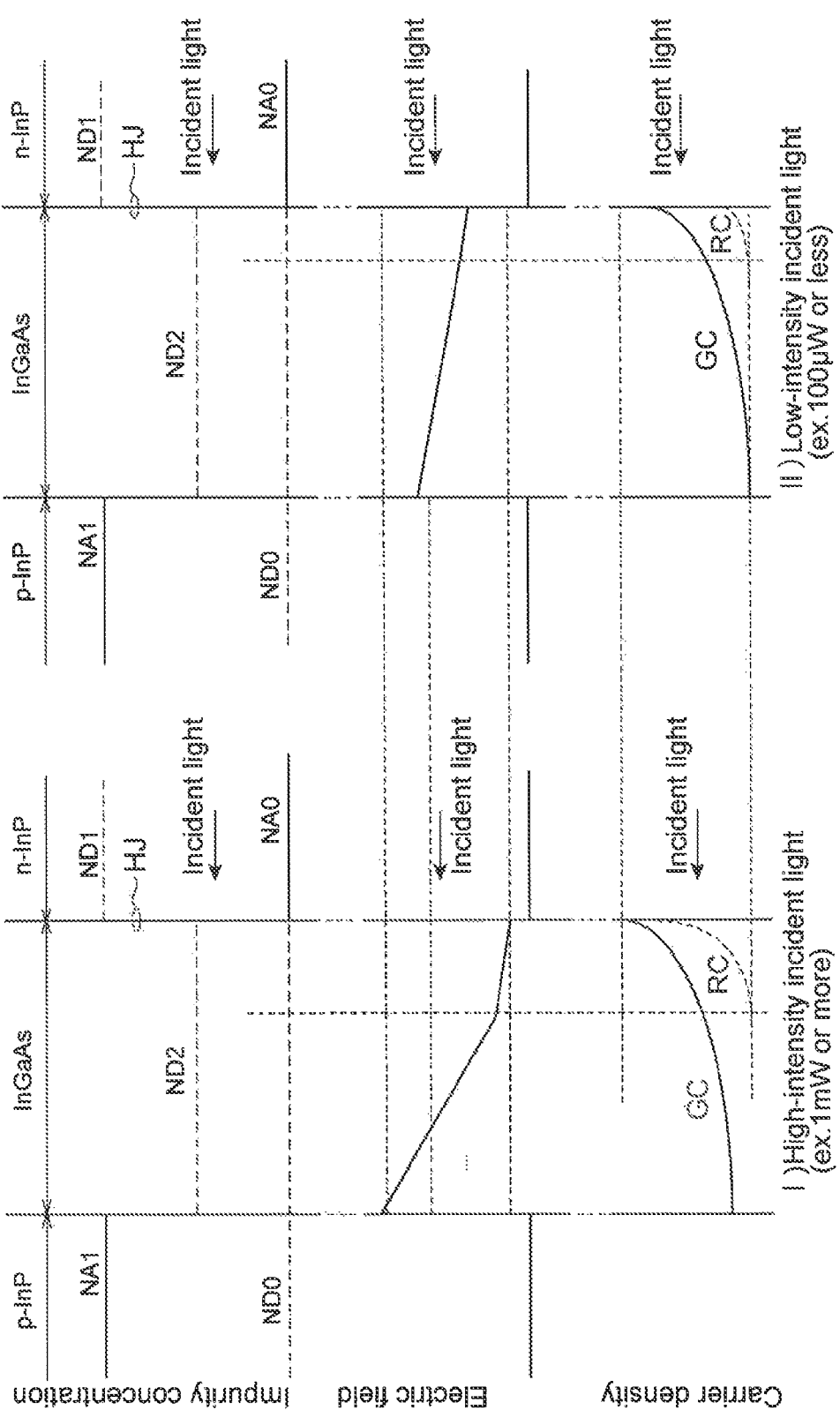

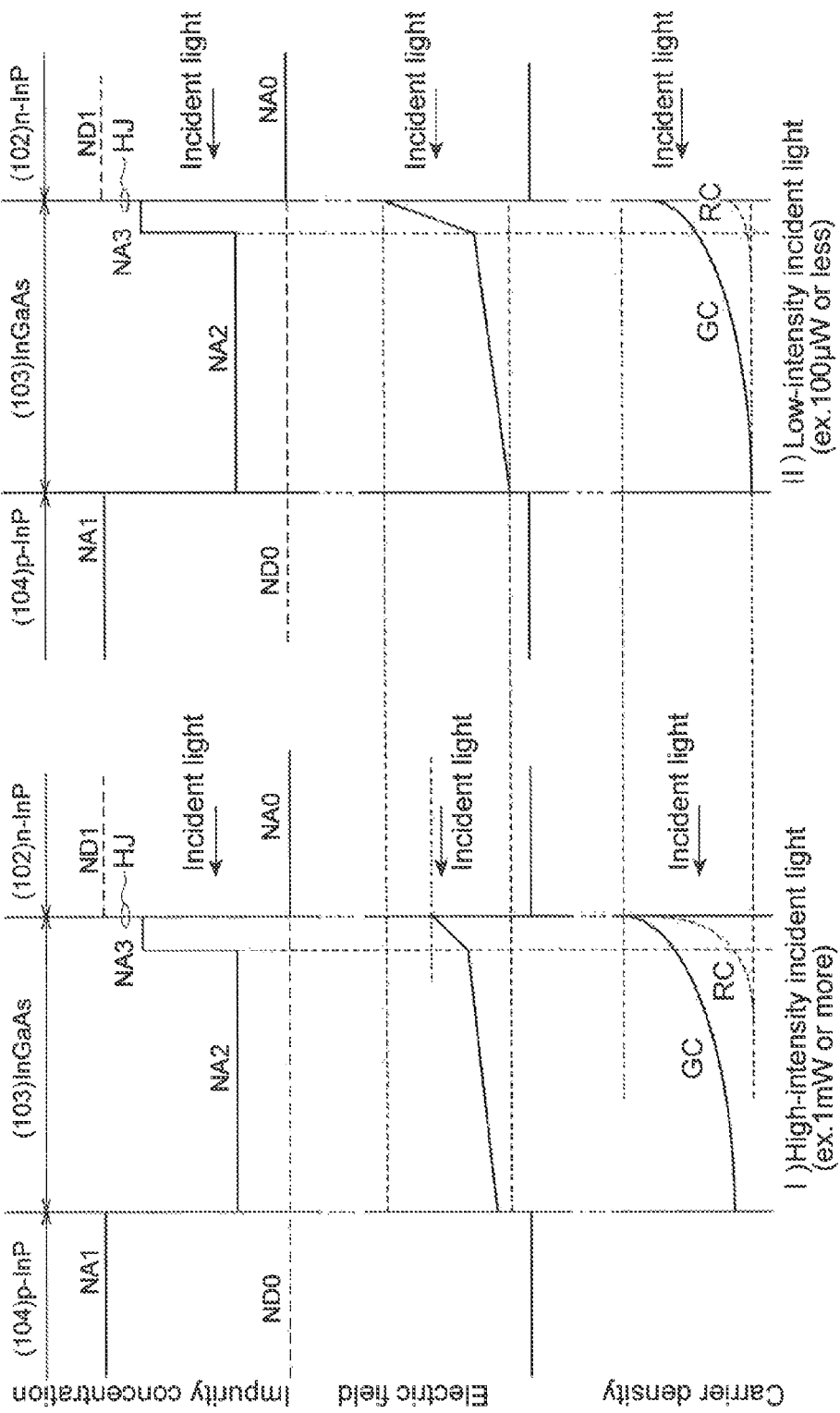

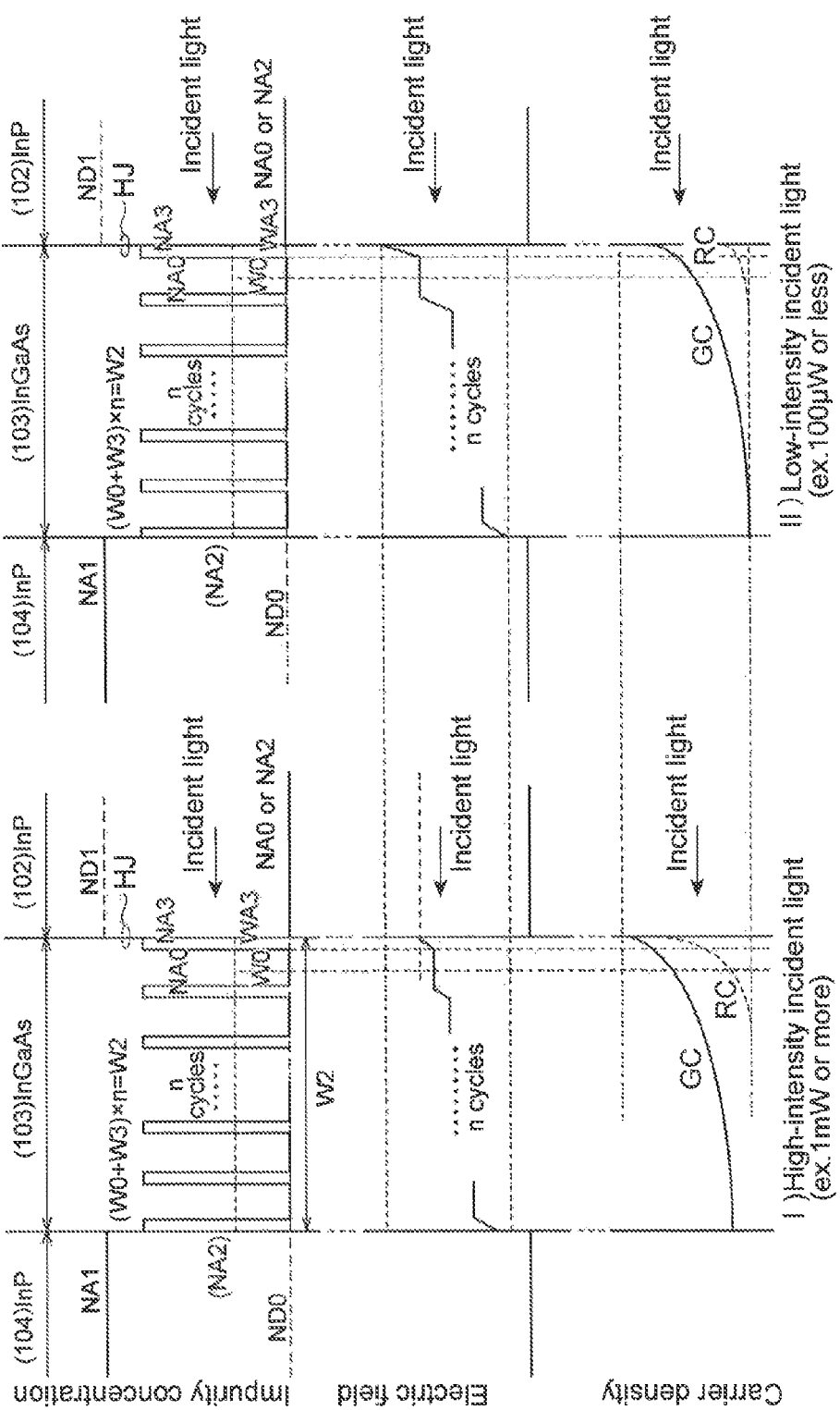

SEMICONDUCTOR LIGHT RECEIVING DEVICE AND LIGHT RECEIVING APPARATUS

BACKGROUND OF THE INVENTION

1. Field of the Invention

The present invention relates to semiconductor light receiving devices and light receiving apparatuses.

2. Description of the Related Art

Patent Literature 1 (Japanese Unexamined Patent Application Publication No. 01-259578) describes a semiconductor light receiving device. This semiconductor light receiving device includes an i-type InGaAs optical absorption layer. Patent Literature 2 (Japanese Unexamined Patent Application Publication No. 03-038887) describes a planar semiconductor light receiving device. This semiconductor light receiving device includes an n-type InP buffer layer, an n-type InGaAs optical absorption layer and an InP cap layer disposed on an $n^+$-InP substrate. The n-type optical absorption layer includes an n-region and an $n^+$-region. The cap layer includes a Zn-doped InP layer. On the Zn-doped InP layer, a p-side electrode is disposed. On the backside of the $n^+$-InP substrate, an n-side electrode having an opening is disposed.

SUMMARY OF THE INVENTION

In the semiconductor light receiving device of Patent Literature 1, an i-InGaAs layer is disposed on an $(n^+)$-type InP layer. A $(p^+)$-type InGaAs layer is disposed on the i-InGaAs layer. The i-region (i-InGaAs layer) and the $p^+$-region ($(p^+)$-type InGaAs layer) constitute an optical absorption layer. In the planar semiconductor light receiving device of Patent Literature 2, a p-n junction is formed at the junction between the Zn-doped InP layer in the cap layer, and the optical absorption layer.

There has been a demand that small and highly reliable light receiving devices be provided at low cost. Further, low power consumption and low voltage driving need to be realized in combination with the miniaturization of light receiving devices. Such a need arises because commercially available integrated circuits are driven at a low voltage. Therefore, the voltage available for driving light receiving devices will be reduced in accordance with the power supply voltage. For example, the magnitude of voltage applied to light receiving devices is not more than 2 V (for example, about 1 V) in low-power-consumption integrated circuits. Further, particularly in 40 G/100 Gbps high-speed optical communication systems, characteristics of high photoelectric conversion efficiency (or quantum efficiency, for example 70% or more) and high speed response (for example, 20 GHz or more) are required for the light receiving devices even under the incident of high-power (for example, about 3 mW) signal light.

A semiconductor light receiving device according to the present invention includes (a) a substrate having an incident surface receiving light incident on the semiconductor light receiving device and a principal surface opposite to the incident surface; (b) a first semiconductor layer disposed on the principal surface of the substrate, the first semiconductor layer defining one of a cathode region and an anode region; (c) a light absorbing region disposed on the first semiconductor layer; and (d) a second semiconductor layer disposed on the light absorbing region, the second semiconductor layer defining the other of the cathode region and the anode region and forming a junction with the light absorbing region. The light absorbing region includes a semiconductor layer having a conductivity type opposite to the conductivity type of the first semiconductor layer. In addition, the semiconductor layer of the light absorbing region forms a p-n junction with the first semiconductor layer.

For example, a configuration will be described as an example in which the first semiconductor layer defines a cathode region and the second semiconductor layer defines an anode region. According to such a semiconductor light receiving device, light incident through the incident surface of the substrate enters the optical absorption layer and is converted into an electric signal at the p-n junction. The p-n junction is formed at the interface between the p-type semiconductor layer of the light absorbing region and the cathode region. Because the p-n junction is located at the boundary between the p-type semiconductor layer of the light absorbing region and the cathode region, the intensity of the electric field in the light absorbing region changes monotonously in the direction extending from the cathode region toward the anode region. This gradient of electric field intensity is formed by effectively utilizing the electric field produced by applying an external voltage to the semiconductor light receiving device. The external voltage is mainly supplied for the migration of pairs of electrons and holes resulting from the photoelectric conversion to obtain a high speed response to optical signals.

The light is incident through the backside of the semiconductor light receiving device. Thus, during the travel to the light absorbing region, the incident light reaches the p-type semiconductor layer of the light absorbing region through the cathode region. As a result, electron-hole pairs are formed in the light absorbing region from the interface between the p-type semiconductor layer of the light absorbing region and the cathode region. The concentration of electron-hole pairs is decreased with increasing distance from the interface. By providing the p-n junction at the interface between the p-type semiconductor layer of the light absorbing region and the cathode region, the region with a high electric field intensity is overlapped with part or the entirety of the region with a high concentration of electron-hole pairs.

In the semiconductor light receiving device according to the aspect of the present invention, the first semiconductor layer may have an n-type conductivity. The semiconductor layer of the light absorbing region may have a p-type conductivity. The acceptor concentration in the semiconductor layer at the p-n junction is preferably lower than the donor concentration in the first semiconductor layer at the p-n junction. In addition, the band gap energies of the cathode region and the anode region are preferably greater than the band gap energy of the light absorbing region.

According to such a semiconductor light receiving device, the first semiconductor layer is a cathode region, and the acceptor concentration at the p-n junction is lower than the donor concentration. Thus, the depletion layer at the p-n junction is mainly formed in the p-type semiconductor layer.

The semiconductor light receiving device according to the aspect of the present invention may further include a semiconductor mesa including the cathode region, the anode region, and the light absorbing region between the cathode region and the anode region; and a cathode electrode connected to the cathode region. The cathode region may have a principal surface. The first semiconductor layer may include the cathode region. The principal surface of the cathode region may include a first area and a second area surrounding the first area. The first area of the cathode region may support the semiconductor mesa. In addition, the cathode electrode may form a junction with the second area of the cathode region.

According to such a semiconductor light receiving device, the cathode electrode is disposed on the second area of the cathode region. Here, the substrate is preferably composed of a semi-insulating semiconductor such as Fe-doped InP. Further, the semiconductor mesa is disposed on the first area of the cathode region. According to this configuration, the cathode electrode does not inhibit the entry of light incident through the backside of the substrate.

The semiconductor light receiving device according to the aspect of the present invention may further include an anode electrode connected to the top surface of the anode region. The second semiconductor layer may include the anode region. Preferably, the substrate is made of InP, the cathode region is made of n-type InP, the light absorbing region is made of InGaAs, and the anode region is made of p-type InP.

In the semiconductor light receiving device according to the aspect of the present invention, the light absorbing region is preferably doped with a p-type impurity in the entire light absorbing region.

In the semiconductor light receiving device according to the aspect of the present invention, the first semiconductor layer may have an n-type conductivity and include the cathode region. The semiconductor layer of the light absorbing region may include a first portion and a second portion each having a p-type conductivity. The first portion may form the p-n junction with the cathode region. The second portion is preferably disposed between the first portion and the anode region. In addition, the acceptor concentration in the first portion of the semiconductor layer is preferably higher than the acceptor concentration in the second portion of the semiconductor layer.

According to such a semiconductor light receiving device, the acceptor concentration in the first portion of the p-type semiconductor layer is higher than the acceptor concentration in the second portion of the p-type semiconductor layer. Thus, the electric field intensity in the vicinity of the p-n junction may be increased.

In the semiconductor light receiving device according to the aspect of the present invention, the first semiconductor layer may have an n-type conductivity and include the cathode region. The light absorbing region may include a plurality of first p-type semiconductor layers and a plurality of second p-type semiconductor layers having an acceptor concentration higher than the acceptor concentration in the first p-type semiconductor layers. The second p-type semiconductor layer may form the p-n junction with the cathode region. The first p-type semiconductor layers and the second p-type semiconductor layers are preferably separate from each other. In addition, the first p-type semiconductor layers and the second p-type semiconductor layers are preferably arranged alternately in the direction extending from the cathode region toward the anode region.

According to such a semiconductor light receiving device, variations in electric field intensity are formed in the region including the array of the first p-type semiconductor layers and the second p-type semiconductor layers. These variations in electric field intensity allow for the migration of holes of the electron-hole pairs formed in the vicinity of the p-n junction.

In the semiconductor light receiving device according to the aspect of the present invention, the substrate may be composed of a semiconductor. The incident surface of the substrate may have a monolithic lens structure.

According to such a semiconductor light receiving device, the setting of the condensing region in the light absorbing region may be adjusted with the monolithic lens.

A light receiving apparatus according to another aspect of the present invention includes (a) the semiconductor light receiving device described above; (b) an optical waveguide; and (c) a support including a power supply line connected to the semiconductor light receiving device, the support having the semiconductor light receiving device therein. The optical waveguide is optically coupled to the incident surface of the semiconductor light receiving device.

The light receiving apparatus according to the present invention may further include a power supply connected to the power supply line of the support, the power supply having a power supply voltage of not more than 2 V.

BRIEF DESCRIPTION OF THE DRAWINGS

FIGS. 3A and 3B are views illustrating structures of photodiodes of Example 1.

FIGS. 4A and 4B are diagrams illustrating impurity concentration profiles, electric field intensity profiles and carrier density profiles in the inside of the photodiode illustrated in FIG. 3A.

FIGS. 5A and 5B illustrate impurity concentration profiles, electric field intensity profiles, and generated and recombined carrier density profiles of the photodiode illustrated in FIG. 3B.

FIGS. 7A and 7B are diagrams illustrating impurity concentration profiles, electric field intensity profiles and carrier density profiles in the inside of the photodiode illustrated in FIG. 6.

FIGS. 9A and 9B are diagrams illustrating impurity concentration profiles, electric field intensity profiles and carrier density profiles in the inside of the photodiode illustrated in FIGS. 8A and 8B.

DESCRIPTION OF THE PREFERRED EMBODIMENTS

The findings of the present invention will be easily understood in consideration of the following detailed description with reference to the drawings attached herewith as examples. Embodiments of semiconductor light receiving devices and light receiving apparatuses according to the present invention will be described below with reference to the attached drawings. If possible, the same symbol will be assigned to the same portion.

Figure 1:
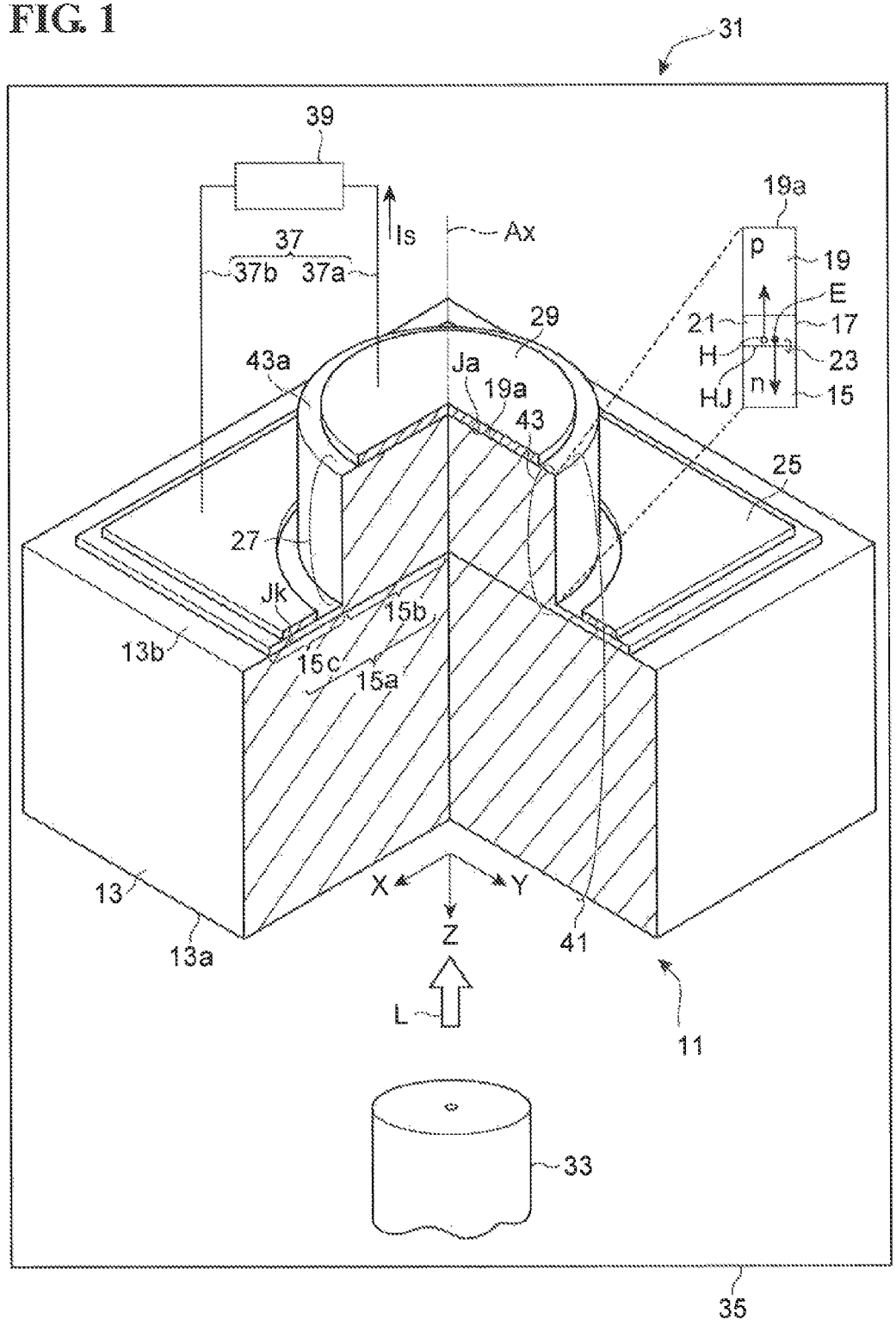
FIG. 1 is a view illustrating a structure of a semiconductor light receiving device according to an embodiment of the invention.

FIG. 1 is a view illustrating a structure of a semiconductor light receiving device (hereinafter, referred to as photodiode for simplicity) according to the present embodiment. A first semiconductor layer (disposed upstream in the direction of the travel of incident light) may be a cathode region or an anode region. In this embodiment, a cathode region is used as the first semiconductor layer. A second semiconductor layer (disposed downstream in the direction of the travel of incident light) is the other of the cathode region and the anode region. Thus, an anode region is used as the second semiconductor layer in this embodiment. In the following description which illustrates examples of the invention, the photodiodes have a backside incident type structure.

A photodiode 11 includes a substrate 13, a cathode region 15, a light absorbing region 17 and an anode region 19. The substrate 13 has an incident surface (backside) 13a and a principal surface 13b. The principal surface 13b of the substrate 13 is on the side opposite to the incident surface 13a. The cathode region 15 is disposed on the principal surface 13b of the substrate 13. The light absorbing region 17 is disposed on the cathode region 15. The cathode region 15 has a principal surface 15a. The anode region 19 forms a junction (in the embodiment, p-p junction) with the light absorbing region 17. The light absorbing region 17 includes a p-type semiconductor layer 21 formed by the addition of an acceptor. The p-type semiconductor layer 21 forms a p-n junction 23 with the cathode region 15. The band gap energies of the cathode region 15 and the anode region 19 are greater than the band gap energy of the light absorbing region 17.

According to this photodiode 11, light L incident through the incident surface 13a of the substrate 13 enters, through the substrate 13, the light absorbing region 17 having a band gap energy lower than the band gap energies of the cathode region 15 and the anode region 19. The light L is then converted into an electric signal Is at the p-n junction 23 formed by the p-type semiconductor layer 21 of the light absorbing region 17 and the cathode region 15. Because the p-n junction 23 is located at the boundary between the p-type semiconductor layer 21 of the light absorbing region 17 and the cathode region 15, the intensity of the electric field produced in the light absorbing region 17 changes monotonously in the direction extending from the cathode region 15 toward the anode region 19.

The p-n junction 23 is located at or near the hetero-junction interface (HJ) between the p-type semiconductor layer 21 of the light absorbing region 17 and the cathode region 15. The gradient in the electric field intensity in the light absorbing region 17 is formed utilizing the electric field produced by applying an external voltage to the photodiode 11. The external voltage is supplied to the photodiode 11 for the migration of electron (E)-hole (H) pairs resulting from the photoelectric conversion.

The light L is incident through the backside of the photodiode 11. Accordingly, the light L incident into the photodiode 11 reaches the p-type semiconductor layer 21 of the light absorbing region 17 through the cathode region 15. As a result, electron-hole pairs are formed in the p-type semiconductor layer 21 of the light absorbing region 17 located near the hetero-junction interface HJ between the p-type semiconductor layer 21 and the cathode region 15. The concentration of electron-hole pairs is decreased with increasing distance from the hetero-junction interface HJ.

By providing the p-n junction 23 in alignment with the hetero-junction interface HJ between the p-type semiconductor layer 21 of the light absorbing region 17 and the cathode region 15, the region with a high electric field intensity is overlapped with part or the entirety of the region with a high concentration of electron-hole pairs in the entirety of the device.

According to this structure, an electric field is formed in the light absorbing region 17 while effectively utilizing the external voltage applied to the photodiode 11. The intensity of this electric field becomes weak in the direction extending from the cathode region toward the anode region. The direction of this gradient is reverse to that in a photodiode which has a p-n junction at the interface between the light absorbing region and the anode region.

In the photodiode 11, the acceptor concentration in the p-type semiconductor layer 21 at the p-n junction 23 is preferably lower than the donor concentration in the cathode region 15 at the p-n junction 23. Because, at the p-n junction 23, the acceptor concentration is lower than the donor concentration, the depletion layer at the p-n junction 23 is formed mainly in the p-type semiconductor layer 21.

The principal surface 15a of the cathode region 15 includes a first area 15b and a second area 15c. The second area 15c surrounds the first area 15b. The photodiode 11 further includes a cathode electrode 25 connected to the cathode region 15. A semiconductor mesa 27 is disposed on the first area 15b of the cathode region 15. The semiconductor mesa 27 includes the light absorbing region 17 and the anode region 19, and also includes a portion of the cathode region 15. The cathode electrode 25 forms a junction Jk with the second area 15c of the cathode region 15.

The cathode electrode 25 is disposed on the second area 15c of the cathode region 15. In this case, the substrate 13 may be composed of a semi-insulating semiconductor. The semiconductor mesa 27 is disposed on the first area 15b of the cathode region 15. Thus, the cathode electrode 25 does not inhibit the entry of the light incident through the backside of the substrate.

The photodiode 11 further includes an anode electrode 29. The anode electrode 29 is connected to the top surface 19a of the anode region 19 and forms a junction Ja. For example, the substrate 13 is composed of Fe-doped InP. The cathode region 15 is composed of n-type InP. The light absorbing region 17 is composed of InGaAs. The anode region 19 is composed of p-type InP.

A light receiving apparatus 31 includes the photodiode 11 with a backside incident type structure described in the present embodiment, an optical waveguide 33, and a support 35. The optical waveguide 33 is optically coupled to the incident surface 13a of the photodiode 11, and may be, for example, an optical fiber, an optical lens or the like. The support 35 has the photodiode 11 therein or supports the photodiode 11. In addition, the support 35 includes power supply lines 37 (37a and 37b). The power supply lines 37 (37a and 37b) are connected to the photodiode 11. In more detail, the power supply line 37a is connected to the anode electrode 29 of the photodiode 11 and the power supply line 37b is connected to the cathode electrode 25 of the photodiode 11.

The light receiving apparatus 31 may further include a power supply 39. The power supply 39 is connected to the power supply lines 37 of the support 35. The power supply voltage of the power supply 39 may be not more than 2 V, and further may be not more than 1.5 V. The anode electrode 29 of the photodiode 11 is connected to the power supply 39 via the power supply line 37a. On the other hand, the cathode electrode 25 of the photodiode 11 is connected to the power supply 39 via the power supply line 37b.

In the light receiving apparatus 31, the support 35 supports and accommodates the photodiode 11, the optical waveguide 33, the power supply lines 37 and the power supply 39.

In the embodiment, in the photodiode 11, the substrate 13 is composed of a semiconductor and the incident surface 13a of the substrate 13 has a monolithic lens structure.

According to the photodiode with this backside incident type structure, the setting of the region condensing incident light in the light absorbing region is adjusted with the monolithic lens.

Figure 2A:
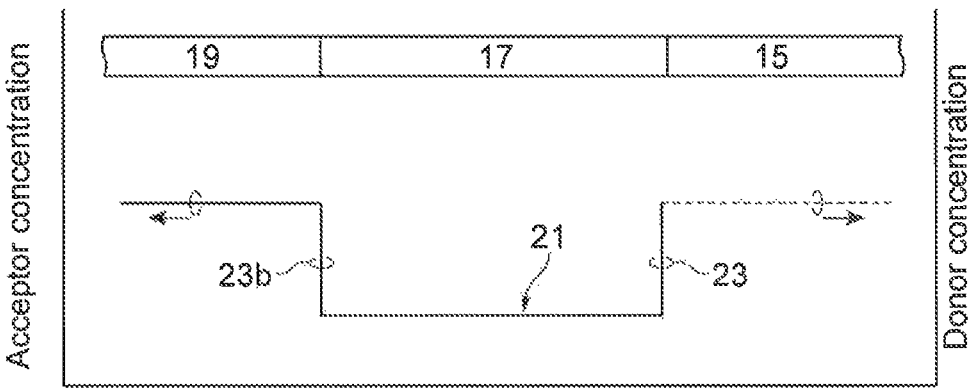
FIGS. 2A, 2B and 2C are diagrams illustrating impurity concentration profiles in the inside of the photodiode illustrated in FIG. 1.

In one example of the photodiodes 11, as illustrated in FIG. 2A, an acceptor (a p-type impurity) is added to the entirety of the light absorbing region 17, thus forming the p-type semiconductor layer 21. The p-type semiconductor layer 21 forms a p-p junction 23b with the anode region 19. Further, the p-type semiconductor layer 21 forms a p-n junction 23 with the cathode region 15. Because the cathode electrode and the anode electrode do not inhibit the entry of incident light, the photodiode 11 exhibits high quantum efficiency (high light receiving sensitivity) and high speed response to optical signals. The acceptor concentration in the light absorbing region 17 is not less than $1 \times 10^{14}$ cm$^{-3}$ and not more than $1 \times 10^{15}$ cm$^{-3}$. The acceptor concentration in the anode region 19 is not less than $1 \times 10^{18}$ cm$^{-3}$ and not more than $1 \times 10^{19}$ cm$^{-3}$. The donor concentration in the cathode region 15 is not less than $1 \times 10^{18}$ cm$^{-3}$ and not more than $1 \times 10^{19}$ cm$^{-3}$. The intensity of the electric field in the light absorbing region 17 changes monotonously in the direction extending from the cathode region 15 toward the anode region 19.

Figure 2B:
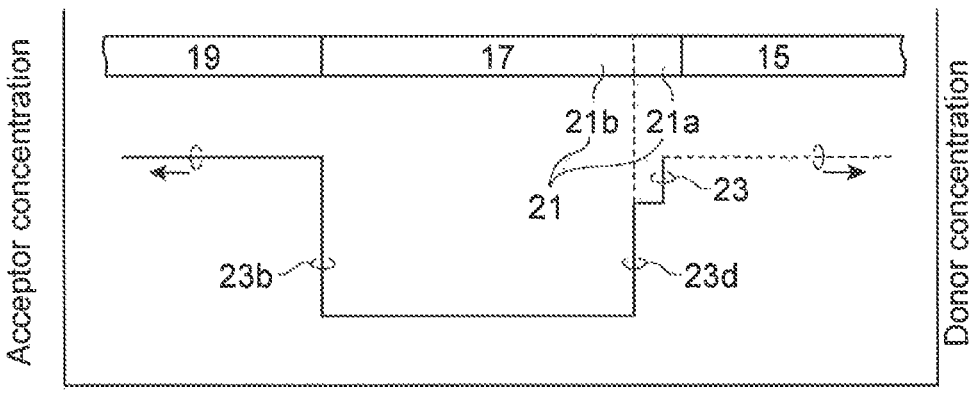

In one example of the photodiodes 11, as illustrated in FIG. 2B, the p-type semiconductor layer 21 includes a first portion 21a and a second portion 21b. The first portion 21a forms a p-n junction 23 with the cathode region 15. The second portion 21b is disposed between the first portion 21a and the anode region 19. In this example, the second portion 21b forms a junction 23b with the anode region 19. Further, the second portion 21b forms a junction 23d with the first portion 21a. The acceptor concentration in the first portion 21a of the p-type semiconductor layer 21 is higher than the acceptor concentration in the second portion 21b of the p-type semiconductor layer 21. According to this photodiode 11, the intensity of the electric field in the vicinity of the p-n junction 23 is increased because the acceptor concentration in the first portion 21a is higher than the acceptor concentration in the second portion 21b.

Figure 2C:
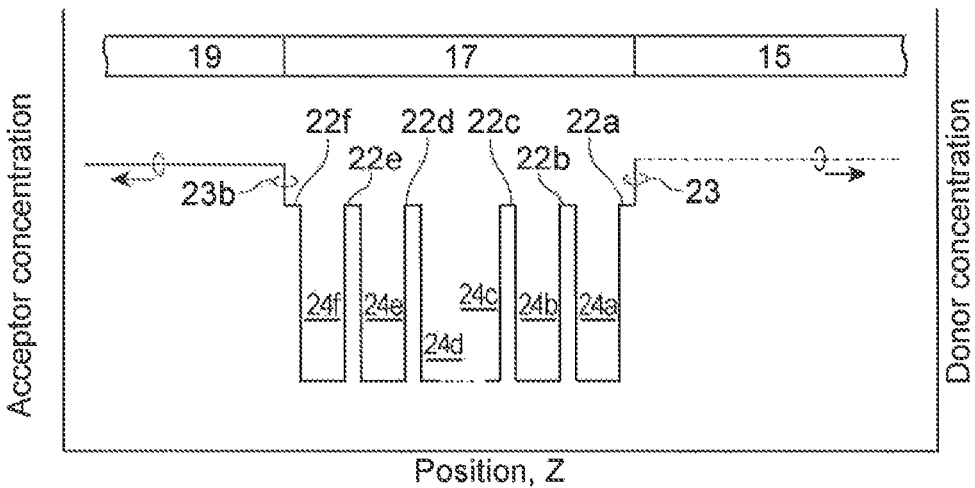

In one example of the photodiodes 11, as illustrated in FIG. 2C, the light absorbing region 17 includes p-type semiconductor layers 24a, 24b, 24c, 24d, 24e and 24f, and other p-type semiconductor layers 22a, 22b, 22c, 22d, 22e and 22f. In the embodiment, the p-type semiconductor layers 24a, 24b, 24c, 24d, 24e and 24f are first p-type semiconductor layers, and other p-type semiconductor layers 22a, 22b, 22c, 22d, 22e and 22f are second p-type semiconductor layers. Further, the light absorbing region 17 includes the p-type semiconductor layers 24a, 24b, 24c, 24d, 24e and 24f between the adjacent layers of these other p-type semiconductor layers. The acceptor concentrations in the p-type semiconductor layers 22a, 22b, 22c, 22d, 22e and 22f are higher than the acceptor concentrations in the p-type semiconductor layers 24a, 24b, 24c, 24d, 24e and 24f. In the light absorbing region 17, the p-type semiconductor layers 22a, 22b, 22c, 22d, 22e and 22f, and the p-type semiconductor layers 24a, 24b, 24c, 24d, 24e and 24f are separate from one another. Further, the p-type semiconductor layers 22a, 22b, 22c, 22d, 22e and 22f, and the p-type semiconductor layers 24a, 24b, 24c, 24d, 24e and 24f are arranged in the direction extending from the cathode region 15 toward the anode region 19. The p-type semiconductor layers 22a, 22b, 22c, 22d, 22e and 22f, and the p-type semiconductor layers 24a, 24b. 24c, 24d, 24e and 24f are arranged alternately to one another. The p-type semiconductor layer 22f forms a p-p junction 23b with the anode region 19. According to this photodiode 11, variations in electric field intensity are formed in the region including the array of the p-type semiconductor layers 22a, 22b, 22c, 22d, 22e and 22f as well as the p-type semiconductor layers 24a, 24b, 24c, 24d, 24e and 24f. These variations in electric field intensity allow for the migration of holes of the electron-hole pairs formed in the vicinity of the p-n junction 23.

In the configurations described hereinabove, any (n$^-$)-type regions and/or (n$^+$)-type regions are not formed in the light absorbing region 17, and a p-type semiconductor portion (for example, the impurity concentration level NA2 is about 1e15/cm$^3$) is arranged in the entirety of the light absorbing region 17. Here, 1e15 means $1 \times 10^{15}$. Alternatively, a (p$^+$)-type semiconductor portion (for example, the impurity concentration level NA3 is about 1e16 to 1e17/cm$^3$) is arranged on the substrate side in the light absorbing region 17, namely, at the hetero-junction interface between the light absorbing region 17 and the cathode region 15. Further, an undoped semiconductor portion (the impurity concentration level NA0) or a (p$^-$)-type semiconductor portion (for example, the impurity concentration level NA2 is about 1e14 to 1e15/cm$^3$) is arranged at the hetero-junction interface between the light absorbing region 17 and the anode region 19 on the p-side electrode side. Still alternatively, (p$^+$)-type semiconductor portions (for example, the impurity concentration level NA3 is about 1e16 to 1e17/cm$^3$) and undoped or (p$^-$)-type semiconductor portions (the impurity concentration level NA0, or the impurity concentration level NA2 is, for example, about 1e14 to 1e15/cm$^3$) are periodically arranged in the light absorbing region 17. Here, the impurity concentration level NA0 is denoted as an impurity concentration in an undoped semiconductor. For example, the impurity concentration level NA0 is less than 1e14/cm$^3$.

According to the aforementioned structures of the light absorbing region 17, the carrier density profile of the carriers generated in the entirety of the light absorbing region (hereinafter, the generated carrier density profile) and the electric field intensity profile show a similar tendency.

In the impurity concentration profile illustrated in FIG. 2A, the donor impurity concentration becomes high at the hetero-junction interface (HJ) near the substrate 13. When high-intensity light is incident on the photodiode 11, the density of carrier recombination due to the space-charge effect is increased. As a result, the electric field intensity at the hetero-junction interface associated with a p-n junction tends to be decreased. However, the highest electric field intensity in the light absorbing region (the region in which the carriers migrate toward the anode) is achieved at the hetero-junction interface near the substrate even at a low driving voltage. Further, an electric field intensity can be ensured which is enough to achieve the saturation velocity of carriers (holes) migrating toward the anode electrode in the light absorbing region (here, the carrier transit region). Thus, deteriorations in high frequency response due to transit delay are avoided.

The photodiodes having an impurity concentration profile illustrated in FIG. 2B will be discussed. A high density of carriers generated by the incident of light is obtained in the vicinity of the hetero-junction interface near the substrate 13, and the electric field intensity in the vicinity of the hetero-junction interface near the substrate 13 is further increased according to this type of photodiodes. Thus, a decrease in electric field intensity which occurs at entering light with a higher intensity or operating at a lower voltage is further suppressed. As a result, the highest electric field intensity in the light absorbing region (the region in which the carriers migrate toward the anode) is achieved at the hetero-junction interface (HJ) near the substrate even at a low driving voltage. Further, an electric field intensity can be ensured which is enough to achieve the saturation velocity of carriers (holes) migrating toward the anode electrode in the light absorbing region (here, the carrier transit region). Thus, deteriorations in high frequency response due to transit delay are avoided.

According to the photodiodes having an impurity concentration profile illustrated in FIG. 2C, a further increase can be achieved in terms of the electric field intensity in the vicinity of the hetero-junction interface near the substrate where carriers are generated in a high density by the incident of light.

Further, the electric field intensity in the light absorbing region changes periodically. When high-intensity light is incident, the influences by the decrease in electric field intensity at the hetero-junction interface associated with a p-n junction may be dispersed to the entirety of the optical absorption layer. Thus, it is possible to suppress the influences not only on the transit time of carriers (holes) migrating to the p-side electrode, but also on the transit time of carriers (electrons) migrating toward the substrate.

Referring back to FIG. 1, the photodiode 11 includes a semiconductor structure 41 which has the incident surface 13a configured to receive the light incident on the photodiode 11, and a semiconductor surface 43a (mesa top surface) opposite to the incident surface 13a. The semiconductor structure 41 includes the substrate 13 and a stacked semiconductor layer 43 disposed on the principal surface 13b of the substrate 13. The stacked semiconductor layer 43 includes a first semiconductor layer which is provided on the principal surface 13b of the substrate 13 and is one of a cathode region 15 and an anode region 19, a second semiconductor layer which is the other of the cathode region 15 and the anode region 19, and the light absorbing region 17 disposed between the cathode region 15 and the anode region 19. The first semiconductor layer forms a junction with the light absorbing region 17. The first semiconductor layer, the light absorbing region and the second semiconductor layer are arranged sequentially along the incident directional axis Ax extending from the incident surface 13a toward the semiconductor surface 43a of the semiconductor structure 41. The substrate 13 and the stacked semiconductor layer 43 are arranged sequentially along the incident directional axis Ax. The light absorbing region 17 includes the semiconductor layer 21 that has a conductivity type opposite to the conductivity type of the first semiconductor layer. The semiconductor layer 21 of the light absorbing region 17 forms a p-n junction 23 with the first semiconductor layer.

EXAMPLE 1

FIG. 3A is a view illustrating a structure of a photodiode of Example 1. FIGS. 4A and 4B are diagrams illustrating impurity concentration profiles, electric field intensity profiles and carrier density profiles in the inside of the photodiode illustrated in FIG. 3A. FIG. 4A illustrates an impurity concentration profile, an electric field intensity profile and generated and recombined carrier density profiles in the case of high-intensity incident light (for example, incident light intensity: 1 mW or more). FIG. 4B illustrates an impurity concentration profile, an electric field intensity profile and generated and recombined carrier density profiles in the case of low-intensity incident light (for example, incident light intensity: 100 µW or less). Here, in the generated and recombined carrier density profiles shown in FIGS. 4A and 4B, solid lines GC denote generated carrier density profiles and dashed lines RC denote recombined carrier density profiles. In order to manufacture a photodiode structure of Example 1 illustrated in FIG. 3A, first, a stacked layer structure is formed by sequentially growing the following layers on a semi-insulating InP substrate 101.

N-type (for example, impurity: Si, ND1: impurity concentration 1e18/cm$^3$) InP layer 102 (for example, thickness: 0.5 µm).

P-type (for example, impurity: Zn, NA2: impurity concentration 1e15/cm$^3$) InGaAs layer 103 (for example, thickness: 1 µm).

P-type (for example, impurity: Zn, NA1: impurity concentration 1e18/cm$^3$) InP layer 104.

By etching the stacked layer structure using a dielectric protective film (for example, a SiN film) until the n-type InP layer 102 is exposed, a semiconductor mesa (InP/InGaAs-pin-PD structure) is formed. An anode electrode 105 (for example, Au/Zn/Au or Pt/Ti/Pt/Au) and a cathode electrode 106 (for example, Au/Ge/Au or Pt/Ti/Pt/Au) are formed on the p-type InP layer 104 and the n-type InP layer 102, respectively. The backside of the substrate 101 is dry-etched to form a condenser lens 110 configured to efficiently condense signal light to the light receiving region. An antireflection coating may be disposed on the surface of the lens 110. For example, the antireflection coating is composed of a SiN film.

FIG. 3B illustrates a structure of a backside incident type photodiode which includes an n-type semiconductor layer as a light absorbing region (an optical absorption layer). FIGS. 5A and 5B illustrate impurity concentration profiles, electric field intensity profiles, and carrier density profiles in the inside of the photodiode illustrated in FIG. 3B. FIG. 5A illustrates an impurity concentration profile, an electric field intensity profile and generated and recombined carrier density profiles in the case of high-intensity incident light (for example, incident light intensity: 1 mW or more). FIG. 5B illustrates an impurity concentration profile, an electric field intensity profile and generated and recombined carrier density profiles in the case of low-intensity incident light (for example, incident light intensity: 100 µW or less). Here, in the generated and recombined carrier density profiles shown in FIGS. 5A and 5B, solid lines GC denote generated carrier density profiles and dashed lines RC denote recombined carrier density profiles. The optical absorption layer is composed of an n-type semiconductor having an impurity concentration level ND2 of, for example, about 1e15/cm$^3$. The generated carrier density is high at the hetero-junction interface near the substrate. However, the electric field intensity in the optical absorption layer shows a tendency that is reverse to the generated carrier density profile. That is, the electric field intensity is lower at the hetero-junction interface near the substrate. The profile in FIG. 5A, which corresponds to high incident light intensity conditions, shows that the density of carrier recombination due to the space-charge effect is increased. Because of this, the electric field intensity at the hetero-junction interface near the substrate is lowered. This causes a delay of hole transit to the anode electrode when, for example, the driving voltage is low, resulting in deteriorations in high frequency response. Such devices are not suited for transceivers or receivers used in high-speed optical communication systems in which the miniaturization and power consumption of electronic circuits are required. On the other hand, in order to increase the electric field intensity in the optical absorption layer, the thickness of the optical absorption layer may be reduced. However, in this case, incident light is not sufficiently absorbed in the optical absorption layer due to reducing the thickness of the optical absorption layer.

For use as light receiving devices, quantum efficiency of not less than 70% is required. The quantum efficiency is enhanced by utilizing the reflection of light by the anode electrode so that the light reflected by the anode electrode is absorbed again in the optical absorption layer. In this case, the thickness of the optical absorption layer needs to be at least about 1 µm.

In Example 1, the signal light having a wavelength of, for example, 1.31 µm or 1.55 µm is incident on the backside of the substrate 101. And then, the signal light is absorbed in the light absorbing region (the optical absorption layer). The light which passes through the optical absorption layer is reflected by the anode electrode 105. The reflected light from the anode electrode 105 passes through the optical absorption layer again. Therefore, the quantum efficiency is enhanced because of contribution of the reflected light to photoelectric conversion. In this configuration, the optical absorption layer is formed in a thickness that is effective to satisfy a desired quantum efficiency.

Provided that a low bias voltage of not more than 2 V (for example, about 1 V) is applied, the optical absorption layer having an impurity concentration of about $1e15/cm^3$ is depleted in a thickness of 1 μm or more. Thus, the entirety of the optical absorption layer is depleted even when such a low bias voltage is applied to the photodiode.

Referring to FIGS. 4A and 4B, the optical absorption layer is not doped with a n-type impurity (for example, Si impurity). That is, any n-type region is not formed as shown in the impurity concentration profile of the photodiode. The entirety of the optical absorption layer is doped with a p-type impurity (for example, Zn impurity). Thus, as shown in the electric field intensity profile, the electric field having the highest intensity in the carrier transit region (for example, about 30 kV/cm) is formed at the hetero-junction interface HJ in the light absorbing region near the substrate. As shown in the carrier density profile, the position of the highest electric field intensity agrees with the distribution tendencies in the carrier density profile of carriers generated by the photoelectric conversion of the signal light incident through the backside of the substrate 101 as well as in the carrier density profile of recombined carriers in the optical absorption layer.

Under high incident light intensity conditions (for example, incident light intensity: 3 mW), photodiodes having a n-type semiconductor optical absorption layer show an increase in the density of carrier recombination due to the space-charge effect in the light absorbing region near the substrate. As a result, the electric field intensity at the hetero-junction interface in the light absorbing region near the substrate is decreased, while the electric field intensity at the hetero-junction interface in the light absorbing region near the anode electrode is increased. In contrast, the photodiodes of Example 1 ensure that the highest electric field intensity in the optical absorption layer (in this example, the carrier transit layer) is displayed at the hetero-junction interface near the substrate even when a low driving voltage is applied to the photodiode. Further, the highest carrier density is formed in the vicinity of the hetero-junction interface in the light absorbing region near the substrate 101. Here, an electric field intensity (20 kV/cm or more) can be ensured which is necessary to obtain the saturation velocity of holes migrating toward the anode electrode in the optical absorption layer (the carrier transit region). By obtaining the hole saturation velocity, deteriorations in high frequency response due to transit delay are suppressed.

According to this example, backside incident type photodiodes having characteristics of high quantum efficiency and high frequency response is provided. In addition, these characteristics are obtained at a low driving voltage of not more than 2 V (for example, about 1 V) even under high incident light intensity conditions.

EXAMPLE 2

Figure 6:
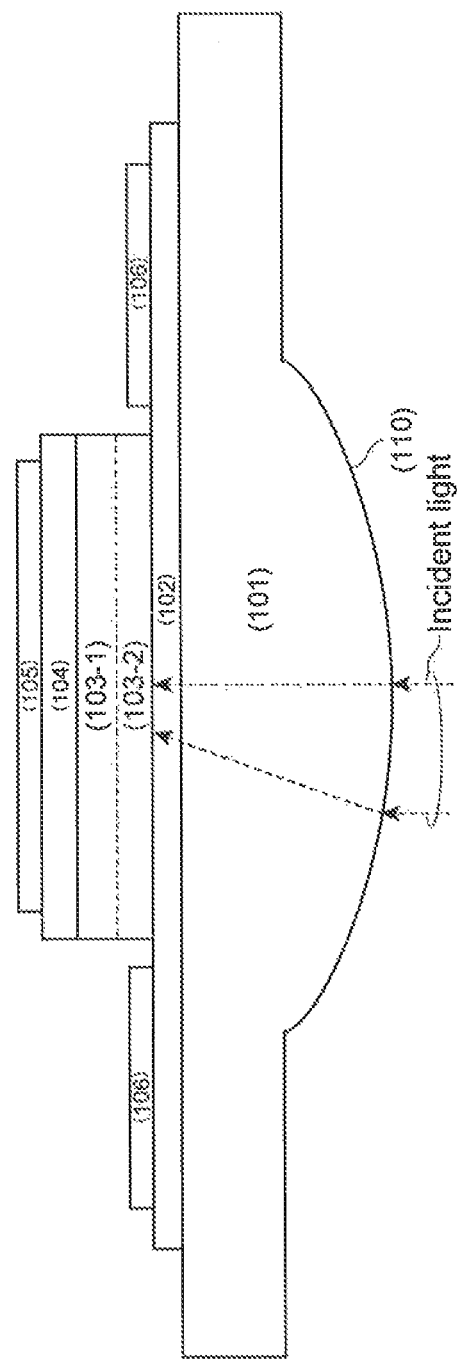
FIG. 6 is a view illustrating a structure of a photodiode of Example 2.

FIG. 6 is a view illustrating a structure of a photodiode of Example 2. FIGS. 7A and 7B are diagrams illustrating impurity concentration profiles, electric field intensity profiles and carrier density profiles in the inside of the photodiode illustrated in FIG. 6. FIG. 7A illustrates an impurity concentration profile, an electric field intensity profile and generated and recombined carrier density profiles in the case of high-intensity incident light (for example, incident light intensity: 1 mW or more). FIG. 7B illustrates an impurity concentration profile, an electric field intensity profile and generated and recombined carrier density profiles in the case of low-intensity incident light (for example, incident light intensity: 100 μW or less). Here, in the generated and recombined carrier density profiles shown in FIGS. 7A and 7B, solid lines GC denote generated carrier density profiles and dashed lines RC denote recombined carrier density profiles. In order to manufacture a photodiode structure of Example 2 illustrated in FIG. 6, first, a stacked layer structure is formed by sequentially growing the following layers on a semi-insulating InP substrate 101.

N-type (for example, impurity: Si, ND1: impurity concentration $1e18/cm^3$) InP layer 102 (for example, thickness: 0.5 μm).

InGaAs layer 103 (for example, thickness: 1 μm).

($P^+$)-type (for example, impurity: Zn, NA3: impurity concentration $1e16/cm^3$) InGaAs layer 103-2 (for example, thickness: 0.1 μm).

Undoped or p-type (for example, impurity: Zn, NA2: impurity concentration $1e14/cm^3$) InGaAs layer 103-1 (for example, thickness: 0.9 μm).

P-type (for example, impurity: Zn, NA1: impurity concentration $1e18/cm^3$) InP layer 104.

By etching the stacked layer structure using a dielectric protective film (for example, a SiN film) until the n-type InP layer 102 is exposed, a semiconductor mesa (InP/InGaAs-pin-PD structure) is formed. An anode electrode 105 (for example, Au/Zn/Au or Pt/Ti/Pt/Au) and a cathode electrode 106 (for example, Au/Ge/Au or Pt/Ti/Pt/Au) are formed on the p-type InP layer 104 and the n-type InP layer 102, respectively. The backside of the substrate 101 is dry-etched to form a condenser lens 110 configured to efficiently condense signal light to the light receiving region. An antireflection coating may be disposed on the surface of the lens 110. For example, the antireflection coating is composed of a SiN film.

The signal light having a wavelength of, for example, 1.31 μm or 1.55 μm is incident through the substrate 101. The signal light is absorbed in the optical absorption layer. The light which passes through the optical absorption layer is reflected by the anode electrode 105. The reflected light from the anode electrode 105 passes through the optical absorption layer again and absorbed in the optical absorption layer. The optical absorption layer is formed in a thickness that is effective to satisfy a desired quantum efficiency.

As already mentioned, the optical absorption layer having an impurity concentration of about $1e15/cm^3$ is depleted in a thickness of 1 μm or more by applying a low bias voltage of not more than 2 V (for example, about 1 V). Thus, the entirety of the optical absorption layer can be depleted. Referring to FIG. 6, the photodiode of Example 2 does not include any region doped with a n-type impurity (for example, Si impurity) in the optical absorption layer. Thus, as shown in the electric field intensity profile in FIGS. 7A and 7B, the highest electric field intensity (about 300 kV/cm) is achieved at the hetero-junction interface in the light absorbing region near the substrate, namely, in the first InGaAs layer 103-2 of ($p^+$)-type conductivity (for example, NA3: Zn impurity concentration $1e16/cm^3$). This electric field intensity is higher than the value at the hetero-junction interface in Example 1. The position of the highest electric field intensity agrees with the highest density of carriers generated by the signal light incident through the substrate as well as the highest recombination density of such carriers. Under high incident light intensity conditions shown in FIG. 7A (for example, intensity higher than that in Example 1, for example, 30 mW), the density of carrier recombination due to the space-charge effect is increased in the region of the optical absorption layer near the substrate. In such a case, the electric field intensity at the hetero-junction interface in the optical absorption layer near the substrate tends to be decreased. In spite of this tendency, however, there is no increase in the electric field intensity at the hetero-junction interface in the light absorbing region near the anode electrode. Thus, the highest electric field intensity is achieved in the ($p^+$)-type InGaAs layer 103-2 (for example, NA3: Zn impurity concentration $1e16/cm^3$) at the hetero-junction interface near the substrate even at a low driving voltage. Here, the impurity concentration in the ($p^-$)-type InGaAs layer 103-1 is set to a lower concentration (for example, NA2: Zn impurity concentration $1e14/cm^3$) than in Example 1. With this configuration, an electric field intensity (20 kV/cm or more) can be ensured which is necessary to obtain the saturation velocity of holes migrating toward the anode electrode. In the photodiode of Example 2, deteriorations in high frequency response due to transit delay are suppressed by the optical absorption layer having a two-layer structure.

The optical absorption layer 103 is not limited to a two-layer structure, and the impurity concentration profile may have a stepwise or continuous gradient decreasing from the hetero-junction interface near the substrate toward the hetero-junction interface near the anode electrode. Such a gradient allows the electric field intensity profile to agree with the tendencies in the generated and recombined carrier density profiles of carriers generated by the photoelectric conversion of the signal light incident through the substrate in the optical absorption layer.

EXAMPLE 3

Figure 8A:
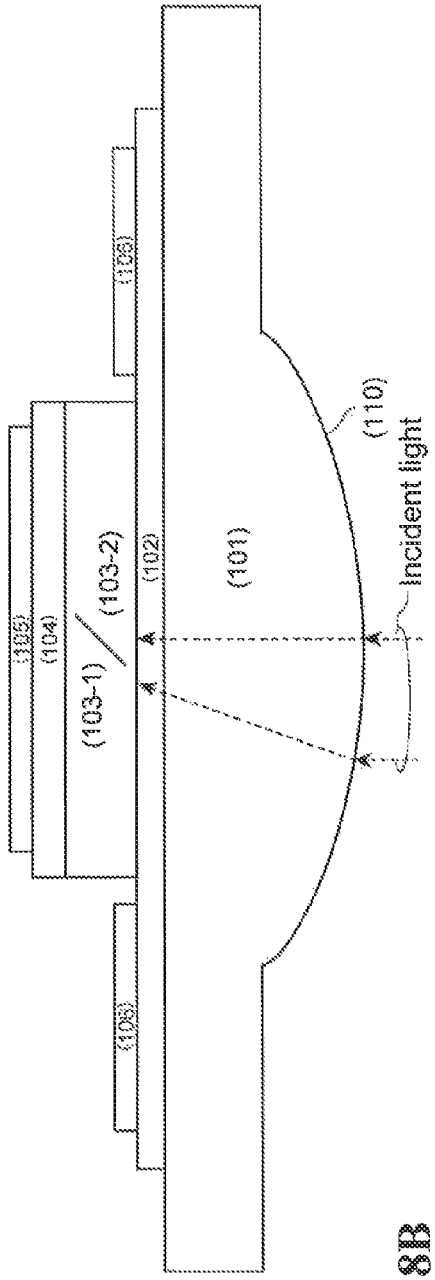
FIGS. 8A and 8B are views illustrating a structure of a photodiode of Example 3.
Figure 8B:
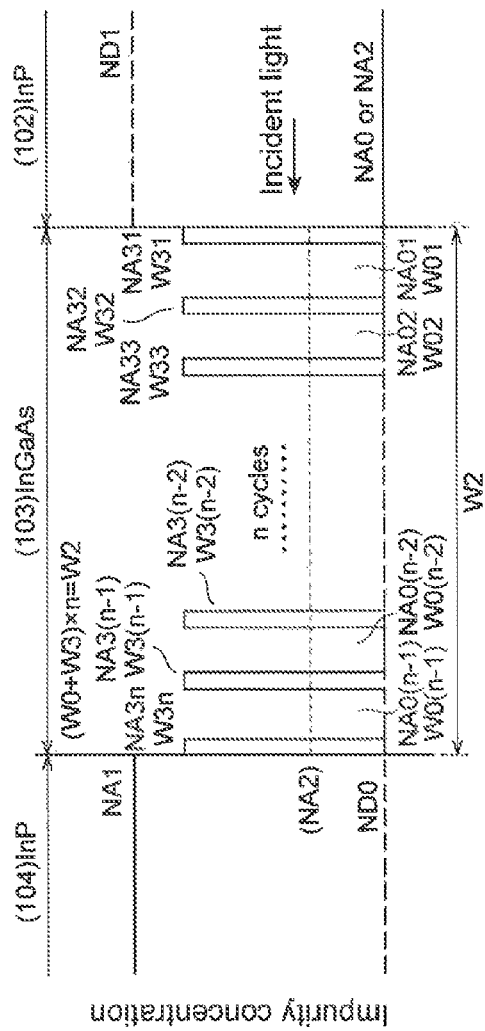

FIGS. 8A and 8B are views illustrating a structure of a photodiode of Example 3. FIG. 8B illustrates an impurity concentration profile of the photodiode illustrated in FIG. 8A. FIGS. 9A and 9B are diagrams illustrating impurity concentration profiles, electric field intensity profiles and carrier density profiles in the inside of the photodiode illustrated in FIG. 8A. FIG. 9A illustrates an impurity concentration profile, an electric field intensity profile and generated and recombined carrier density profiles in the case of high-intensity incident light (for example, incident light intensity: 1 mW or more). FIG. 9B illustrates an impurity concentration profile, an electric field intensity profile and generated and recombined carrier density profiles in the case of low-intensity incident light (for example, incident light intensity: 100 µW or less). Here, in the generated and recombined carrier density profiles shown in FIGS. 9A and 9B, solid lines GC denote generated carrier density profiles and dashed lines RC denote recombined carrier density profiles.

In order to manufacture a photodiode structure of Example 3 illustrated in FIGS. 8A and 8B, first, a stacked layer structure is formed by sequentially growing the following layers on a semi-insulating InP substrate 101.

N-type (for example, impurity: Si, ND1: impurity concentration $1e18/cm^3$) InP layer 102 (for example, thickness: 0.1 µm).

InGaAs layer 103 (for example, thickness: 1 µm).

($P^+$)-type (for example, impurity: Zn, NA3: impurity concentration $1e17/cm^3$) InGaAs layer 103-2 (for example, thickness: 0.001 µm).

Undoped or p-type (for example, impurity: Zn, NA2: impurity concentration $1e14/cm^3$) InGaAs layer 103-1 (for example, thickness: 0.1 µm).

P-type (for example, impurity: Zn, NA 1: impurity concentration $1e18/cm^3$) InP layer 104. In the above structure, the InGaAs layers 103-1 and the InGaAs layers 103-2 are arranged periodically. Here, the ratio of the thickness of the InGaAs layers 103-1 to the thickness of the InGaAs layers 103-2 is 100:1. For example, the thicknesses of the InGaAs layer 103-1 and the InGaAs layer 103-2 are 0.1 µm and 0.001 µm, respectively.

By etching the stacked layer structure using a dielectric protective film (for example, a SiN film) until the n-type InP layer 102 is exposed, a semiconductor mesa (InP/InGaAs-pin-PD structure) is formed. An anode electrode 105 (for example, Au/Zn/Au or Pt/Ti/Pt/Au) and a cathode electrode 106 (for example, Au/Ge/Au or Pt/Ti/Pt/Au) are formed on the p-type InP layer 104 and the n-type InP layer 102, respectively. The backside of the substrate 101 is dry-etched to form a condenser lens 110 configured to efficiently condense signal light to the light receiving region. An antireflection coating may be disposed on the surface of the lens 110. For example, the antireflection coating is composed of a SiN film.

In the photodiode of Example 3, the signal light having a wavelength of, for example, 1.31 µm or 1.55 µm is incident through the substrate 101. The signal light is absorbed in the optical absorption layer. The light which passes through the optical absorption layer is reflected by the anode electrode 105. The reflected light from the anode electrode 105 is returned to be incident again on the optical absorption layer and absorbed in the optical absorption layer. The optical absorption layer is formed in a thickness that is effective to satisfy a desired quantum efficiency.

The semiconductor having a impurity concentration of about $1e15/cm^3$ is depleted in a thickness of at least 1 µm or more by applying a low bias voltage of not more than 2 V (for example, about 1 V). Thus, the entirety of the optical absorption layer in this example can be depleted.

According to the structure in which the ($p^+$)-type (for example, NA3: Zn impurity concentration $1e17/cm^3$) InGaAs layers 103-2 and the (for example, undoped) InGaAs layers 103-1 are arranged alternately, an electric field intensity profile is formed in which the electric field intensity decreases stepwise in the light absorbing region (the carrier transit region) in the direction extending from the substrate toward the anode electrode. This tendency of electric field intensity distribution agrees with the generated and recombined carrier density profiles of carriers generated by the photoelectric conversion of the signal light incident through the substrate in the optical absorption layer. Under high incident light intensity conditions shown in FIG. 9A (for example, 3 mW), the density of carrier recombination due to the space-charge effect is increased in the vicinity of the hetero-junction interface in the light absorbing region near the substrate, and the electric field intensity at the hetero-junction interface near the substrate is lowered. However, the influences by the lowering of electric field intensity are dispersed in the entirety of the optical absorption layer. According to the structure of Example 3, it is possible to suppress the influences not only on the transit time of holes migrating to the anode electrode, but also on the transit time of electrons migrating toward the substrate. At a low driving voltage, the highest electric field intensity in the ($p^+$)-type InGaAs layer 103-2 (for example, NA3: Zn impurity concentration $1e17/cm^3$) is achieved at the hetero-junction interface in the light absorbing region near the substrate. Here, the periodic structure composed of the ($p^+$)-type InGaAs layers 103-2 and the InGaAs layers 103-1 ensures an electric field intensity (20 kV/cm or more) which is necessary to obtain the saturation velocity of holes migrating toward the anode electrode. Thus, deteriorations in high frequency response due to transit delay are suppressed.

Configurations such as those described below may be adopted in this example in which maximums and minimums of impurity concentrations are arranged alternately in the optical absorption layer. The thicknesses and impurity concentrations of the two kinds of layers (first p-type semiconductor layers and second p-type semiconductor layers) constituting the light absorbing region change periodically. The thicknesses and impurity concentrations of the first p-type semiconductor layers, and the thicknesses and impurity concentrations of the second p-type semiconductor layers are represented as illustrated in FIG. 8B. The total thickness of the first p-type semiconductor layers is set to be constant thickness of W3×n in the following examples. Similarly, The total thickness of the second p-type semiconductor layers is set to be constant thickness of W0×n in the following examples.

Basic form: The thicknesses of each of the first p-type semiconductor layers and the second p-type semiconductor layers are constant, and the impurity concentrations in each of the first p-type semiconductor layers and the second p-type semiconductor layers are constant.
$NA31=NA32=\ldots=NA3(n-1)=NA3n=NA3$.
$W31=W32=\ldots=W3(n-1)=W3n$.
$(W31+W32+\ldots+WA(n-1)+W3n=W3\times n)$.
$NA01=N02=\ldots=N0(n-1)=N0n=NA0$ or $NA2$.
$W01=W02=\ldots=W0(n-1)$.
$(W01+W02+\ldots+W0(n-1)=W0\times n)$.

Modification 1: The thickness of the first p-type semiconductor layers is decreased in the direction extending from the substrate to the anode electrode.
$NA31=NA32=\ldots=NA3(n-1)=NA3n=NA3$.
$W31>W32>\ldots>W3(n-1)>W3n$.
$(W31+W32+\ldots+WA(n-1)+W3n=W3\times n)$.
$NA01=N02=\ldots=N0(n-1)=N0n=NA0$ or $NA2$.
$W01=W02=\ldots=W0(n-1)$.
$(W01+W02+\ldots+W0(n-1)=W0\times n)$.

Modification 2: The thickness of the second p-type semiconductor layers is increased (the period of the first p-type semiconductor layers is increased) in the direction extending from the substrate to the anode electrode.
$NA31=NA32=\ldots=NA3(n-1)=NA3n=NA3$.
$W31=W32=\ldots=W3(n-1)=W3n$.
$(W31+W32+\ldots+WA(n-1)+W3n=W3\times n)$.
$NA01=N02=\ldots=N0(n-1)=N0n=NA0$ or $NA2$.
$W0<W02<\ldots<W0(n-1)$.
$(W01+W02+\ldots+W0(n-1)=W0\times n)$.

Modification 3: Modification 1 and Modification 2 are combined.
$NA31=NA32=\ldots=NA3(n-1)=NA3n=NA3$.
$W31>W32>\ldots>W3(n-1)>W3n$.
$(W31+W32+\ldots+WA(n-1)+W3n=W3\times n)$.
$NA01=N02=\ldots=N0(n-1)=NA0$ or $NA2$.
$W01<W02<\ldots<W0(n-1)$.
$(W01+W02+\ldots+W0(n-1)=W0\times n)$.

Modification 4: The carrier concentration in the first p-type semiconductor layers is decreased in the direction extending from the substrate to the anode electrode.
$NA31>NA32>\ldots>NA3(n-1)>NA3n$.
$W31=W32=\ldots=W3(n-1)=W3n$.
$(W31+W32+\ldots+WA(n-1)+W3n=W3\times n)$.
$(NA31\times W31+NA32\times W32+\ldots+NA3(n-1)\times W3(n-1)+NA3n\times W3n=NA3\times W3\times n)$.
$NA01=N02=\ldots=N0(n-1)=NA0$ or $NA2$.
$W01=W02=\ldots=W0(n-1)$.
$(W01+W02+\ldots+W0(n-1)=W0\times n)$.

Modification 5: Modification 1 and Modification 4 are combined.
$NA31>NA32>\ldots>NA3(n-1)>NA3n$.
$W31>W32>\ldots>W3(n-1)>W3n$.
$(W31+W32+\ldots+WA(n-1)+W3n=W3\times n)$.
$(NA31\times W31+NA32\times W32+\ldots+NA3(n-1)\times W3(n-1)+NA3n\times W3n=NA3\times W3\times n)$.
$NA01=N02=\ldots=N0(n-1)=NA0$ or $NA2$.
$W01=W02=\ldots=W0(n-1)$.
$(W01+W02+\ldots+W0(n-1)=W0\times n)$.

Modification 6: Modification 2 and Modification 4 are combined.
$NA31>NA32>\ldots>NA3(n-1)>NA3n$.
$W31=W32=\ldots=W3(n-1)=W3n$.
$(W31+W32+\ldots+WA(n-1)+W3n=W3\times n)$.
$(NA31\times W31+NA32\times W32+\ldots+NA3(n-1)\times W3(n-1)+NA3n\times W3n=NA3\times W3\times n)$.
$NA01=N02=\ldots=N0(n-1)=N0n=NA0$ or $NA2$.
$W01<W02<\ldots<W0(n-1)$.
$(W01+W02+\ldots+W0(n-1)=W0\times n)$.

Modification 7: Modification 1, Modification 2 and Modification 4 are combined.
$NA31>NA32>\ldots>NA3(n-1)>NA3n$.
$W31>W32>\ldots>W3(n-1)>W3n$.
$(W31+W32+\ldots+WA(n-1)+W3n=W3\times n)$.
$(NA31\times W31+NA32\times W32+\ldots+NA3(n-1)\times W3(n-1)+NA3n\times W3n=NA3\times W3\times n)$.
$NA01=N02=\ldots=N0(n-1)=N0n=NA0$ or $NA2$.
$W0<W02<\ldots<W0(n-1)$.
$(W01+W02+\ldots+W0(n-1)=W0\times n)$.

In Examples 1 to 3, the following variations are possible. While the optical absorption layer in Examples 1 to 3 is an InGaAs layer, the optical absorption layer is not limited thereto. For example, the optical absorption layer may be composed of other semiconductors having a longer bandgap wavelength than the signal light wavelength such as InGaAsP and AlGaInAs. For example, the difference between the signal light wavelength and the bandgap wavelength of the optical absorption layer may be increased by means of changing a composition of semiconductor constituting the optical absorption layer with a stepwise or continuous gradient configuration in the direction extending from the substrate toward the optical absorption layer (hereinafter, referred to as "incident direction") so as to average the generated and recombined carrier density profiles of carriers generated by the photoelectric conversion of the signal light incident through the substrate in the optical absorption layer.

In Examples 1 to 3, for example, the agreement of the electric field intensity profile with the generated and recombined carrier density profiles of carriers occurring by the photoelectric conversion of the signal light in the optical absorption layer has been described with reference to the backside incident type photodiodes. The feature of the photodiodes in these embodiments is that the electric field intensity profile agrees with the generated and recombined carrier density profiles. Thus, this feature may be applied to photodiodes having structures different from those in Examples 1 to 3.

In Examples 1 to 3, photodiodes have been described with respect to InP/InGaAs materials as exemplary semiconductor materials. The semiconductor materials are not limited to these materials. For example, the structures according to these examples may be applied to homo-junction InGaAs-pin photodiodes. Further, an InP/InGaAsP/InGaAs hetero-junction interface may be provided in place of the InP/InGaAs hetero-junction interface. Furthermore, the structures in the above examples may be applied to GaAs/AlGaAs photodiodes.

While Examples 1 to 3 describe photodiodes with a pin structure, the epi structure formed on the generated carrier transit layer InGaAs is not limited. For example, the structures in the above examples may be applied to avalanche photodiode (APD) structures.

In the photodiode structures described in the aforementioned examples, the conductivity types may be reversed. While SiN films are described as exemplary dielectric films (antireflection coatings) in the above examples, the materials are not limited thereto and may be fluorides, oxides and nitrides of elements such as silicon, aluminum and titanium. In the PD structures described above, photoelectric conversion circuits may be formed by providing, on the semi-insulating InP substrate, InP electronic devices (for example, hetero-junction bipolar transistors), capacitors and resistors.

Although the present invention has been described in detail based on examples, the scope of the invention is not limited to those examples presented above and variations are possible without departing from the scope of the invention.

As discussed above, light receiving devices according to the aforementioned embodiments are configured to ensure high quantum efficiency and to respond at high speed to optical signals at a low driving voltage of not more than 2 V (for example, about 1 V) even under high incident light intensity conditions. The use of light receiving devices according to the aforementioned embodiments realizes the miniaturization and power consumption saving of electronic circuits in transceivers or receivers. Further, small and environmentally-friendly transceivers or receivers suited for 40 G/100 Gbps high-speed optical communication systems can be provided.

What is claimed is:

1. A semiconductor light receiving device comprising:
   a substrate having an incident surface receiving light incident on the semiconductor light receiving device and a principal surface opposite to the incident surface;
   a first semiconductor layer disposed on the principal surface of the substrate, the first semiconductor layer having a n-type conductivity and including a cathode region;
   a light absorbing region disposed on the first semiconductor layer; and
   a second semiconductor layer disposed on the light absorbing region, the second semiconductor layer including an anode region and forming a junction with the light absorbing region, wherein
   the light absorbing region includes a semiconductor layer having a p-type conductivity,
   the semiconductor layer of the light absorbing region forms a p-n junction with the first semiconductor layer,
   at the p-n junction, an acceptor concentration in the semiconductor layer of the light absorbing region is lower than a donor concentration in the first semiconductor layer, and
   the band gap energies of the cathode region and the anode region are greater than the band gap energy of the light absorbing region.

2. The semiconductor light receiving device according to claim 1, further comprising:
   a semiconductor mesa including the cathode region, the anode region, and the light absorbing region between the cathode region and the anode region; and
   a cathode electrode connected to the cathode region, wherein
   the cathode region has a principal surface that includes a first area and a second area surrounding the first area,
   the first area of the cathode region supports the semiconductor mesa, and
   the cathode electrode forms a junction with the second area of the cathode region.

3. The semiconductor light receiving device according to claim 1, further comprising an anode electrode connected to a top surface of the anode region,
   wherein
   the substrate is made of InP,
   the cathode region is made of n-type InP,
   the light absorbing region is made of InGaAs, and
   the anode region is made of p-type InP.

4. The semiconductor light receiving device according to claim 1, wherein
   the light absorbing region is doped with a p-type impurity in the entire light absorbing region.

5. The semiconductor light receiving device according to claim 1, wherein
   the semiconductor layer of the light absorbing region includes a first portion and a second portion each having a p-type conductivity,
   the first portion forms the p-n junction with the cathode region,
   the second portion is disposed between the first portion and the anode region, and
   the acceptor concentration in the first portion of the semiconductor layer of the light absorbing region is higher than the acceptor concentration in the second portion of the semiconductor layer of the light absorbing region.

6. The semiconductor light receiving device according to claim 1, wherein
   the light absorbing region includes a plurality of first p-type semiconductor layers and a plurality of second p-type semiconductor layers having an acceptor concentration higher than the acceptor concentration in the first p-type semiconductor layers,
   one of the second p-type semiconductor layers of the light absorbing region that is in contact with the cathode region forms the p-n junction with the cathode region,
   the first p-type semiconductor layers and the second p-type semiconductor layers of the light absorbing region are separate from each other, and
   the first p-type semiconductor layers and the second p-type semiconductor layers of the light absorbing region are arranged alternately in a direction extending from the cathode region toward the anode region.

7. The semiconductor light receiving device according to claim 1, wherein
   the substrate is composed of a semiconductor, and
   the incident surface of the substrate has a monolithic lens structure.

8. A light receiving apparatus comprising:
   a semiconductor light receiving device,
   an optical waveguide, and
   a support including a power supply line connected to the semiconductor light receiving device, the support having the semiconductor light receiving device therein,
   wherein the semiconductor light receiving device includes:
   a substrate having an incident surface receiving light incident on the semiconductor light receiving device and a principal surface opposite to the incident surface;
   a first semiconductor layer disposed on the principal surface of the substrate, the first semiconductor layer having an n-type conductivity and including a cathode region;

a light absorbing region disposed on the first semiconductor layer; and a second semiconductor layer disposed on the light absorbing region, the second semiconductor layer including an anode region and forming a junction with the light absorbing region, wherein the light absorbing region includes a semiconductor layer having a p-type conductivity, the semiconductor layer of the light absorbing region forms a p-n junction with the first semiconductor layer, at the p-n junction, an acceptor concentration in the semiconductor layer of the light absorbing region is lower than a donor concentration in the first semiconductor layer, and the band gap energies of the cathode region and the anode region are greater than the band gap energy of the light absorbing region, and wherein the optical waveguide is optically coupled to the incident surface of the semiconductor light receiving device.

9. The light receiving apparatus according to claim 8, further comprising a power supply connected to the power supply line of the support, the power supply having a power supply voltage of not more than 2 V.

10. A semiconductor light receiving device comprising:

a substrate having an incident surface receiving light incident on the semiconductor light receiving device and a principal surface opposite to the incident surface;

a first semiconductor layer disposed on the principal surface of the substrate, the first semiconductor layer having an n-type conductivity and including a cathode region;

a light absorbing region disposed on the first semiconductor layer, the light absorbing region including a semiconductor layer; and a second semiconductor layer disposed on the light absorbing region, the second semiconductor layer including an anode region and forming a junction with the light absorbing region, wherein the semiconductor layer of the light absorbing region includes a first portion and a second portion that each have a p-type conductivity, the first portion forms a p-n junction with the cathode region, the second portion is disposed between the first portion and the anode region, and an acceptor concentration in the first portion is higher than an acceptor concentration in the second portion.

* * * * *